United States Patent [19]

Davidson, deceased et al.

[11] 3,929,528

[45] Dec. 30, 1975

[54] FABRICATION OF MONOCRIPTALLINE SILICON ON INSULATING SUBSTRATES UTILIZING SELECTIVE ETCHING AND DEPOSITION TECHNIQUES

[75] Inventors: Uryon S. Davidson, deceased, late of Scottsdale, Ariz.; by Amil J. Ajamie, administrator; James B. Price, both of Phoenix, Ariz.

[73] Assignee: Motorola, Inc., Chicago, Ill.

[22] Filed: Jan. 12, 1973

[21] Appl. No.: 323,011

[52] U.S. Cl. .................... 148/175; 29/577; 29/580; 156/7; 156/17; 357/4; 357/49; 357/60; 357/90

[51] Int. Cl.[2] ................. H01L 21/20; H01L 21/306; H01L 21/76

[58] Field of Search ............ 148/174, 175; 117/201, 117/212; 156/17, 7; 317/235 E, 235 F; 29/577, 580; 357/4, 49, 60, 90

[56] References Cited

UNITED STATES PATENTS

| | | | |
|---|---|---|---|
| 3,429,756 | 2/1969 | Groves | 156/17 |
| 3,587,166 | 6/1971 | Alexander et al. | 29/577 |
| 3,721,588 | 3/1973 | Hays | 148/175 |

OTHER PUBLICATIONS

Finne et al., "Water-Amine Complex . . . . System for Etching Silicon," J. Electrochem. Soc., Vol. 114, No. 9, Sept. 1967, pp. 965–970.

Thornton, C. G., "Metal Bathtubs . . . . Reduce Collector Resistance," Electronic Equipment Engin., Dec. 1964, pp. 18–20.

*Primary Examiner*—L. Dewayne Rutledge
*Assistant Examiner*—W. G. Saba
*Attorney, Agent, or Firm*—Harry M. Weiss; Maurice J. Jones, Jr.

[57] ABSTRACT

The methods result in starting material on substrates in which dielectrically isolated integrated circuits, each including a plurality of active devices having substantial gains at high frequencies and small geometries, can be manufactured. One method utilizes a silicon wafer having a [100] crystallographic orientation, on which a P+ layer is formed. This P+ layer has an exposed high concentration surface and a relatively low concentration surface interfacing the wafer. A first insulating material is then formed on the high concentration surface and a first supporting material is formed on the insulating material. The P+ layer provides an etch retardant for an anisotropic etch which removes much of the wafer to expose a substantially planar P+ surface of relatively low concentration on which a thin layer of high quality monocrystalline silicon is epitaxially formed. If a P+ buried layer is not desired, then the process is continued by providing a second insulating layer on the epitaxial silicon with a second supporting material thereon. Next, the first supporting material, first insulating layer and the P+ layer are removed to provide starting material which does not have a P+ buried layer therein.

14 Claims, 14 Drawing Figures

FABRICATION OF MONOCRIPTALLINE SILICON ON INSULATING SUBSTRATES UTILIZING SELECTIVE ETCHING AND DEPOSITION TECHNIQUES

CROSS REFERENCE TO RELATED APPLICATION

This application is related to the application entitled, "Thin Single Crystal Silicon on an Insulating Substrate and Improved Dielectric Isolation Processing Method," of Robert G. Hays and Chongkook Rhee, Ser. No. 171,453, filed Aug. 13, 1971 and assigned to the same assignee as the subject invention.

This application issued on Mar. 20, 1973 as U.S. Pat. No. 3,721,588.

BACKGROUND OF THE INVENTION

Monolithic integrated circuits have low cost, high reliability and other characteristics which make them desirable for replacing many circuits previously provided in discrete form. Such integrated circuits generally include a plurality of circuit components which must be electrically isolated from each other. In the past, this isolation has been accomplished by forming the peripheral material of each component from semiconductor material of a first conductivity type which is surrounded by semiconductor material of a second conductivity type to provide a P-N junction which is reverse biased to provide isolation. However, a capacitor is formed by each of these reverse biased isolation junctions which tends to undesirably reduce the high frequency response of such integrated circuits. Moreover, in an irradiated environment, there P-N isolation junctions tend to function as generators of undesired photocurrents. Thus, to provide integrated circuits including isolated bipolar or field effect devices having fast switching times, high frequency responses and increased radiation immunity, techniques have been developed which locate resistive or dielectric materials between the individual components of each integrated circuit rather than the P-N isolation junctions.

Each of these prior art dielectric isolation processes have problems associated with them. For instance, some of these processes require a plurality of steps including mask alignments, etches and depositions of various materials to form a starting material or substrate, which makes them tedius, costly and time consuming. Others of these processes, which are more simple and direct, involve the hetero-epitaxial growth of monocrystalline silicon directly on an insulating substrate such as sapphire (aluminum oxide) or spinel (aluminum magnesium oxide). Because of the dissimilarities in crystalline arrangement between such non-silicon substrates and silicon, it is difficult to grow thin layers of monocrystalline silicon having uniform thicknesses on such substrates of sufficiently high quality to serve as a starting material in which active devices having state-of-the-art frequency and switching responses can be fabricated. This is because the crystalline lattice of the silicon attempts to conform to that of the foregoing aluminum oxide substrates causing internal stresses in the silicon at the interface and because the aluminum tends to diffuse into the silicon. Also, since the temperature coefficients of expansion for aluminum oxides and silicon differ, stresses are created at the interface in response to extreme temperatures which also have a deleterious effect on the molecular arrangement of the silicon.

Furthermore, it is difficult to provide an insulating substrate of uniform thickness having a sufficiently planar surface to facilitate the growth of thin layers of high quality monocrystalline silicon suitable for high density device fabrication. This is partly because of the mechanical tolerances involved in the machinery used for grinding and polishing such surfaces. Although the problem of providing a sufficiently planar surface is partly solved by the etch stop process disclosed by the aforementioned related application, that process indicates that the monocrystalline silicon layer be grown on a rather heavily doped, P+ silicon layer, which in some instances can cause undesirable effects on the crystalline quality of the silicon abutting the doped layer. More particularly, fluctuations in the diffusion process forming the boron doped, P+ surface can cause the amount of boron being applied to the silicon to exceed the solid solubility limit so that boron silicide is precipitated on the surface on which the epitaxial layer is grown. Also, because the process of the related application requires subsequent steps before and after the epitaxial layer is formed to complete the starting material, it is possible for undesirable out-diffusion to occur into the epitaxial layer from the P+ layer and for the handling to injure the epitaxial layer. Hence, although the process of the related application is suitable for providing relatively high quality silicon on an insulating substrate as compared to silicon on either sapphire or spinel, there are applications where still higher quality epitaxial silicon on an insulating substrate is desirable.

Defects in the crystalline structure of silicon grown on either non-silicon surfaces or on highly doped silicon surfaces have deleterious effects on the electrical characteristics of active devices fabricated therefrom. For instance such imperfections provide charge carriers at forbidden energy levels which cause excess leakage currents in response to reverse voltages to result in increased device power dissipation without contributing to amplification capability. Moreover, crystalline lattice imperfections may create recombination centers which decrease the current gain of bipolar transistors and deflect carriers passing through the lattice to thereby decrease carrier mobility with a resulting undesired decrease in high frequency response. To compensate for either the non-planarity of the substrate surface on which single crystalline silicon is formed or the imperfections in crystal lattice at the interface therebetween, or both, it is sometimes necessary to provide an undesirably thick layer of monocrystalline silicon which may result in devices having large capacitances which further decrease their high frequency responses.

SUMMARY OF THE INVENTION

One object of this invention is to provide a method of manufacture whereby a layer of monocrystalline silicon having a high degree of crystalline integrity is provided on an insulating substrate.

Another object is to provide a method of manufacture facilitating the formation of a thin layer of monocrystalline silicon of controlled thickness which has a planar surface.

Still another object is to provide a starting material or substrate for the manufacture of dielectrically isolated monolithic integrated circuit including a high density of active devices having improved high frequency responses, switching characteristics and immunity to radiation.

A further object is to provide a method of manufacture, for starting material in which integrated circuits can be formed, which method utilizes a self-limiting etch process and wherein silicon semiconductor material is grown on a silicon surface which does not have to be as heavily doped as in some prior art methods.

A still further object is to provide a method of manufacture of a structure including a thin layer of epitaxial, monocrystalline silicon on an insulating substrate whereby the epitaxial silicon is deposited on a freshly cleaned surface and whereby, in one embodiment, process steps subsequent to the formation of the epitaxial silicon are not required to complete the starting material.

In brief, the methods of the invention each provide a thin layer of high quality monocrystalline silicon on an insulating substrate which is suitable for use as a starting material for the manufacture of monolithic integrated circuits including high density, dielectrically isolated bipolar or field effect devices having substantial gains at high frequencies. One method includes the steps of providing a planarized silicon wafer having a predetermined crystallographic orientation, and diffusing or epitaxially growing a P+ layer which has a low impurity concentration surface either included in or adjoining the wafer and an exposed higher impurity concentration surface. Next, a first insulating layer is provided on the exposed high concentration surface, and a first supporting material is formed thereon. Then, the silicon substrate is subjected to an anisotropic etchant which removes the silicon at least to the low concentration surface of the P+ layer, which acts as an etch stop or retardant and tends to provide a planar surface. The high quality monocrystalline silicon layer is epitaxially grown or deposited on the planar surface to complete a starting material for devices having P+ buried layers provided by the P+ etch stop layer.

If buried layers are not desired, the above process can be extended by providing a further insulating layer on the exposed surface of the epitaxial silicon and further supporting material thereon. Then the first supporting material, the first insulating material, and the P+ layer are removed to expose the previously buried surface of the epitaxial layer. Hence, another starting material is thereby provided by the above additional process steps which is suitable for supporting the fabrication of monolithic integrated circuits having dielectrically isolated devices which do not require P+ buried layers.

DESCRIPTION OF THE PREFERRED EMBODIMENT

Figure 1:
FIGS. 1 through 8 illustrate successive structures formed during one process of the invention whereby a starting material is provided which includes a thin layer of high quality monocrystalline silicon over an insulating substrate with a P+ buried layer therebetween.

FIGS. 1 through 8 inclusive, which are not drawn to scale, illustrate one embodiment of the method of the invention whereby a thin layer of monocrystalline silicon having a high degree of crystalline integrity, precisely controlled thickness and resistivity, and a planar surface is provided on an insulating substrate. In FIG. 1, a substrate or wafer 10 is shown which may be of a [100] crystallographic orientation and a thickness, on the order of 20 mils, sufficient to provide mechanical support for subsequent handling. According to usual practice substrate 10 may be circular in shape, having a diameter on the order of 2 inches, and it may be slightly N doped. Known planarization techniques are employed to reduce the variation in thickness of silicon wafer 10 to less than one tenth of a thousandth of an inch (mil) so that the bottom and top surfaces thereof lie in substantially parallel planes.

Figure 2:
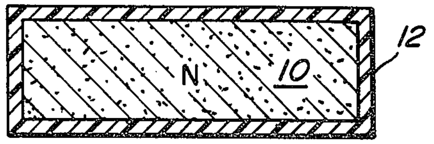
Figure 3:
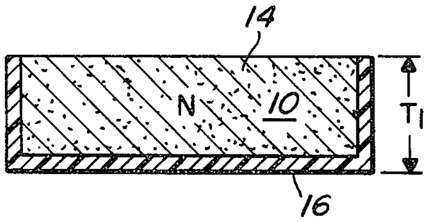

Next, a thin layer of insulating material such as silicon dioxide or silicon nitride 12, which may have a thickness on the order of 10 thousand angstroms, is provided on the surfaces of wafer 10, as illustrated in FIG. 2. A portion of insulating layer 12 is then removed, by polishing for instance, to expose surface 14 of wafer 10, as shown in FIG. 3. After the exposure of surface 14, the thickness, $T_1$ of the material between upper surface 14 of the wafer and lower surface 16 of the insulating layer 12 is recorded for use in a subsequent process step.

Figure 4:
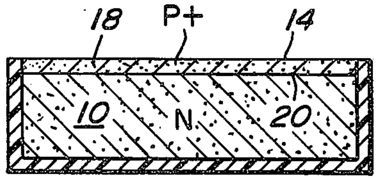

As shown in FIG. 4, a diffusion of a boron acceptor impurity, may be formed through surface 14 of the wafer to create P+ layer 18 having an impurity concentration, near surface 14, on the order of from $3 \times 10^{19}$ to $10 \times 10^{19}$ atoms per cubic centimeter (cc). Alternatively, layer 18 can be provided by either epitaxial growth of boron doped silicon or boron phosphide. A boron phosphide layer would inherently include a uniform distribution of boron and phosphorous atoms and would be selected to provide an etch retardant. The impurity concentration provided by doped epitaxial or diffused silicon is graded into the substrate 10 by the diffusion process and at a depth of approximately 2 microns from the surface, for instance, the concentration is of the order of $1 \times 10^{17}$ atoms/cc. The material at this depth is designated and referred to herein, as a low concentration surface 20.

If layer 18 is formed by epitaxial growth on the top surface of the substrate of an acceptor doped silicon, a more uniform distribution of the acceptor impurity results within most of layer 18. However, because of out-diffusion, the impurity concentration still decreases toward the interface between the lightly doped wafer and the P+ layer. In any case, the fact that doped silicon layer 18 operates as an etch stop for an anisotropic potassium hydroxide (KOH) etchant is utilized, as will be subsequently described, to provide a surface having a greater degree of planarization on which a thin layer of silicon of controlled thickness can be formed than is presently obtainable by known mechanical means employed in standard dielectric isolation fabrication.

The addition of the acceptor-type impurity into a silicon layer 18 results in a change of the crystallography of the silicon atoms thereof as compared to the crystallography of intrinsic silicon. More specifically, according to Vegard's Law, the lattice parameter, $a_0$ of doped silicon is directly proportional to the concentration of dopant which is in this instance boron. The alloying stress resulting from the dopant is proportional to the change in lattice constant $a_0$ and therefore is least at surface 20. Hence, the degree of crystalline change of the silicon included in layer 18 whether formed by diffusion or by epitaxial techniques, is greatest at upper surfaces where the concentration is highest, while at the lower or buried portions where the concentration is lowest only relatively minor changes result. More particularly, since the silicon crystalline lattice structure is less changed at surface 20 than at surface 14, surface 20 forms a much more suitable surface on which to epitaxially grow a more nearly perfect, monocrystalline layer.

Figure 5:
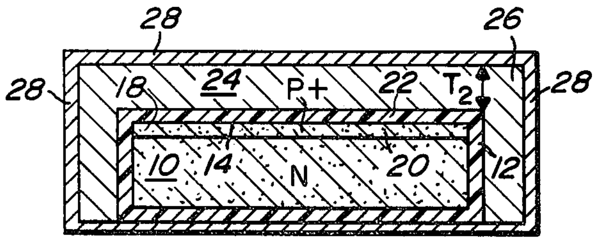

As shown in FIG. 5, a subsequent layer of either silicon dioxide or silicon nitride 22, which may isolate the as yet unformed epitaxial layer, is next provided on high concentration surface 14 of P+ etch stop layer 18. Next, "handle" or supporting structure 24, which may be comprised of polycrystalline silicon, is formed on some of the outwardly facing surfaces of insulating layer 12 and on the surface of insulating layer 22, as shown in FIG. 5. Insulating layer 22 forms a barrier which prevents out-diffusion of the boron impurity from layer 18 into polycrystalline silicon layer 24 as it forms. Hence, layer 18 out-diffuses only into material 10. As a result, layer 18 does not have to be as thick as it otherwise would have to be if layer 18 was not walled off by insulating layer 22 to remain at a concentration sufficient to act as an effective etch stop. Polycrystalline silicon layer 24 has a known thickness, $T_2$, which is perhaps on the order of 4 mils, sufficient to provide mechanical support during subsequent processing steps. For protection of support material 24 during subsequent processing, layer 28 of silicon nitride is next deposited thereon, as shown in FIG. 5.

Figure 6:
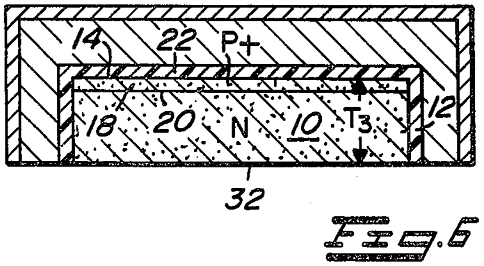

Portions of the silicon nitride layer 28, polycrystalline layer 24 and silicon wafer 10 are removed by grinding the bottom portion of the structure of FIG. 5 to form the structure shown in FIG. 6. By utilizing the thickness dimensions $T_1$, of silicon 10 and thickness $T_2$, of the polycrystalline silicon 24, the grinder can be set such that the thickness, $T_3$ (see FIG. 6) between high concentration surface 14 and exposed surface 32 of silicon 10 is on the order of 1 mil.

Figure 7:
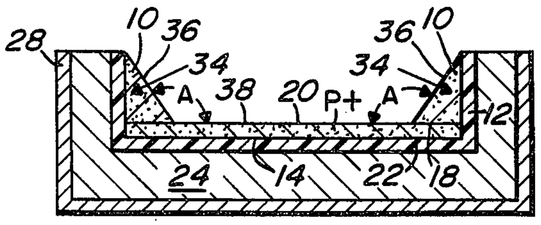

Next, the structure shown in FIG. 6 is inverted, as indicated in FIG. 7, and submitted to an anisotropic etch utilizing a potassium hydroxide reagent (KOH) which proceeds to etch away silicon material 10 at least to the low concentration surface 20 of formerly buried etch resistant layer 18. Although it has been indicated that silicon 10 is of a [100] crystallographic orientation, silicon of the [110] crystallographic orientation also could be used but etches at a slower rate. Silicon of the [111] crystallographic orientation probably would not be used for substrate 10 because of its slow etch rate in a KOH etch and because the etch stop layer 18 may not function therein. Assuming that silicon 10 is of the [100] orientation, it will be removed such that residual silicon material 34 will remain to form a somewhat V-shaped channel having outwardly facing side surfaces 36 forming angles A, as shown in FIG. 7, on the order of 125° with respect to surface 20 of P+ layer 18.

It has been discovered that the KOH etch rate of boron doped silicon, having a [100] orientation, varies widely when the boron concentration of the silicon ranges from about $3 \times 10^{18}$ to $1 \times 10^{20}$ atoms/cc and using a standard etch solution of KOH-$H_2O$-IPA. More particularly the etch rate of undoped or doped up to $1 \times 10^{17}$ atoms/cc [100] silicon is about 1.0 micron of thickness per minute whereas etch rates of about 0.95, 0.1 and 0.02 microns thickness per minute have been observed for respective boron concentrations of about $3 \times 10^{18}$, $7 \times 10^{19}$ and $1.0 \times 10^{20}$ atoms/cc. Therefore, the portions of silicon wafer 10 located between surface 32 and relatively lightly doped surface 20 of layer 18 is removed much more rapidly to provide surface 38 than the silicon between surfaces 20 and 14 of doped layer 18.

The degree of planarization of surface 20 tends to be controlled by the degree of planarization of layer 14 rather than the grinding step forming surface 32 of FIG. 6, and the planarization of surface 20 tends to control the planarization of surface 38 on which the monocrystalline epitaxial layer is to be formed. Since the boron concentration increases as the buried layer 18 is penetrated by the etchant, the etch rate is further decreased the farther the etch proceeds. This tends to planarize surface 38 and to provide a freshly etched or cleaned base on which a thin layer of high quality epitaxial silicon of uniform thickness can be grown, and in which active devices having a high density and substantial gain at high frequencies can be fabricated.

Figure 8:
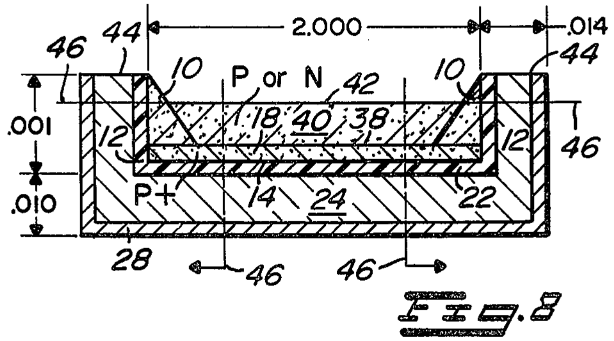

As shown in FIG. 8, epitaxial layer 40 is grown on planar surface 38. This epitaxial process also contributes to the formation of a thin layer, more specifically between 1 and 5 microns, of epitaxial silicon 40 of closely controlled, uniform thickness. From a crystallographic viewpoint, epitaxial silicon such as that of layer 40 is generally thought to nucleate in a stable diamond-like structure. However, the crystalline structure of layer 40, is influenced by the structure of surface 38 on which it forms. Since surface 38 may be a boron doped silicon having a surface concentration less than surface 14, the crystalline structure of the portion of layer 40 near surface 38 will tend to be deformed somewhat but not as much as if that portion had been grown on a more highly doped surface, such as 14, which is the case according to the closest prior art process of which the applicants are aware and which is described in the application cited at the beginning of the subject specification. Thus, the crystalline lattice, molecular arrangement and periodicity of epitaxial layer 40 do not have as many defects, irregularities, or imperfections as they would have if layer 40 had been grown on higher concentration surface 14.

Such crystalline defects interact with charge carriers, such as electrons or holes, in a variety of ways to have a deleterious effect upon the electrical characteristics of active devices formed therein. For instance, defects deflect charge carriers thereby decreasing mobility, which is the proportionality constant between drift velocity and electric field strength. Hence, a minority carrier attempting to travel through a base region of a bipolar transistor formed in crystalline semiconductor material having many defects might not proceed to the collector before the driving field reverses direction, thereby decreasing the high frequency gain of the device. Moreover, carrier lifetime, which is the average life of a carrier, is decreased by recombination centers associated with some imperfections in semiconductor crystals and results in an increased recombination rate and, therefore, decreased gain at all frequencies. Finally, defects in crystalline structure also result in the existence of carriers at forbidden energy levels which provide leakage currents in response to reverse voltages across junctions, such as utilized in bipolar transistors and junction field effect transistors. Such leakage currents are undesirable because they increase internal device power dissipation without contributing to amplification capability.

Since epitaxial layer 40, has a high degree of crystalline integrity as compared to silicon on saphire, it provides a suitable starting material of substrate in which dielectrically isolated active devices can be formed. Moreover, because the degree of crystalline imperfection at surface 38 is reduced and because surface 38 is substantially planar, epitaxial layer 40 can be made very thin to reduce device capacitances and of a uniform thickness between 1 and 10 microns. Epitaxial layer 40 can be grown by known processes to be slightly N doped to provide a substrate in which N channel, dielectrically isolated field effect transistors may be fabricated. Alternatively, epitaxial layer 40 may be lightly P doped to form a substrate in which integrated circuits utilizing dielectrically isolated PNP bipolar transistors can be formed.

As shown in FIG. 8, portions of polycrystalline silicon layer 24, and associated portions of nitride layer 28 and silicon dioxide layer 12 extend above top surface 42 of epitaxial layer 40 to form alignment surfaces for a "non-contact" mask, which does not have to come in contact with epitaxial layer 40. Hence, a greater degree of protection to the mask and surface 42 of epitaxial layer 40 may be provided by the structure shown in FIG. 8 than by standard mask and wafer "contact" alignment techniques. This is because it is not necessary to place a mask and epitaxial layer 40 in direct contact and then rotate them with respect to each other, as is generally the case. Moreover, because the distance between top surface 42 of epitaxial layer 40 and alignment surfaces 44, of the portions extending above surface 42, can be predetermined, the mask can be designed to eliminate parallax errors otherwise occurring in some "non-contact" processes. If a "non-contact" process is not desired, then the edge of the wafer, which forms only a small part of the volume thereof, can be trimmed as indicated by lines 46 of FIG. 8, which is not drawn to scale. Dimensions are included on FIG. 8 for purposes of illustration.

The above described method of manufacture, therefore, provides a layer 40 of monocrystalline silicon having a high degree of crystalline integrity on a substrate 24 from which it is insulated by layer 22. Since epitaxial layer 40 was formed on a smooth, planar, freshly etched surface 38 having a relatively small concentration of P-type acceptor impurities, layer 40 exhibits a high degree of crystalline perfection in all incremental volumes located more than a short distance above surface 38. The fact that layer 40 is formed on a freshly etched and, therefore, clean surface 38 also contributes a higher degree of crystalline integrity than prior art processes forming the silicon on a freshly diffused surface. Furthermore, since epitaxial layer 40, in the above embodiment of the invention, is formed as a final step, it is not subject to injury possibly incurred due to subsequent handling steps as are sometimes necessary in prior art processes in order to complete the starting material. Hence, a method of manufacture has been disclosed which provides a suitable starting material for the manufacture of monolithic integrated circuits including active devices having improved high frequency responses and switching characteristics and which require a P+ buried layer provided by layer 18.

Although the structure shown in FIG. 8 provides a starting material which is superior in many respects to those provided by the prior art, the resulting structure does not include P+ layer 18 which might be undesirable in some applications. More specifically, layer 18 tends to provide a small amount of capacitance which though being substantially less than the capacitance created by prior art junction isolation, perhaps could still be troublesome. Moreover, if the structure of FIG. 8 is subjected to subsequent high temperature process steps, layer 18 has a tendency to out-diffuse. Therefore, FIGS. 9 through 14 illustrate structures formed by subsequent process steps which can be applied to the substrate shown in FIG. 8 to provide a further starting material comprised of monocrystalline silicon on an insulating substrate but wherein a buried P+ layer is not provided.

Figure 9:
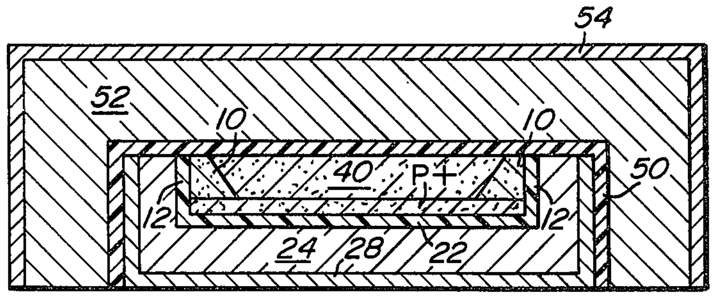
FIGS. 9 through 14 depict further successive structures formed by additional processing steps utilized to convert the starting material of FIG. 8 into a starting material which does not include a P+ buried layer.

As indicated by line 46, the structure of FIG. 8 may be modified by grinding portions of silicon nitride layer 28, polycrystalline silicon layer 44, insulating layer 22 and silicon 10 to provide a surface which is even with top surface 42 of epitaxial layer 40. Next, as shown in FIG. 9, an insulating layer 50 of either silicon dioxide or silicon nitride is formed on the resulting exposed top surfaces of epitaxial layer 40, silicon 10, silicon dioxide layer 12, polycrystalline layer 24 and nitride layer 28. Polycrystalline material 52 or other supporting material is then formed on some of the outwardly facing surfaces of insulating layer 50. Also as shown in FIG. 9, silicon nitride layer 54 is then deposited on some of the outwardly facing surfaces of polycrystalline silicon layer 52.

Figure 10:
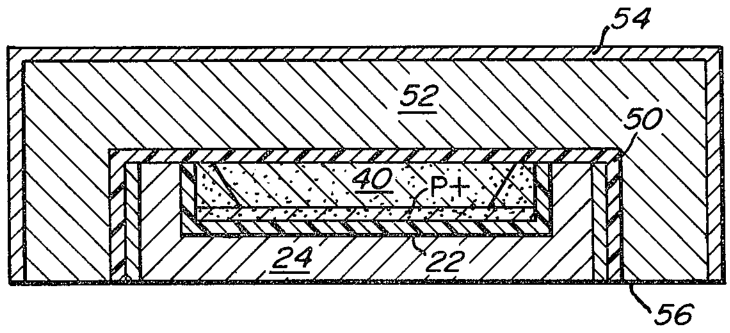
Figure 11:
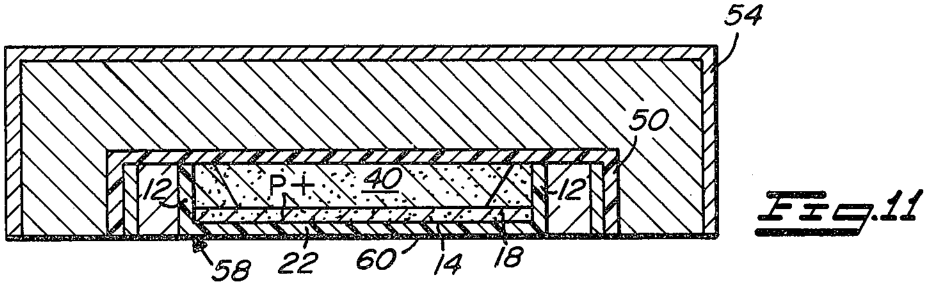

Next, as shown in FIG. 10, the bottom surface of the structure shown in FIG. 9 is lapped until silicon nitride layer 28 is removed to thereby provide surface 56. Surface 56 is then subjected to an etch, such as a standard solution of nitric, hydrofluoric, and acetic acids ($HNO_3$-HF-HACE, 5-1-1), suitable for removing selected portions of supporting materials 24 and 52. As a result, surface 58, as shown in FIG. 11, and which includes bottom surface 60 of insulating layer 22, is exposed. Surface 58 is next subjected to an etchant, such as hydrofluoric acid, which removes oxide 22 to thereby expose high concentration surface 14 of P+ layer 18. P+ layer 18 is then removed by either a mechanical polishing technique or a selective etchant such as $3HNO_3$·IHF·8HACE. Subsequently, a light etch might be employed to remove the portions of epitaxial layer 40 which were immediately adjacent to P+ surface 38 to thereby provide a resulting exposed planar surface 68, shown in FIG. 13.

Thus, layer 40 is comprised of monocrystalline silicon having a high degree of crystalline integrity and a uniform thickness so that it is suitable for providing a starting material in which field effect and bipolar integrated circuit devices can be fabricated which have high frequency responses and fast switching time. More specifically, layer 40 can be N doped to enable the structure of FIG. 13 to provide a substrate in which NPN bipolar, P channel MOS and N channel field effect devices can be fabricated. Furthermore, other epitaxial layers may be provided on selectively doped layer 40 to complete a substrate in which other types of electrical devices can be fabricated.

Figure 12:
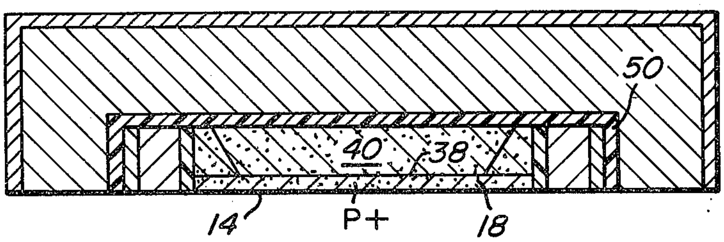
Figure 13:
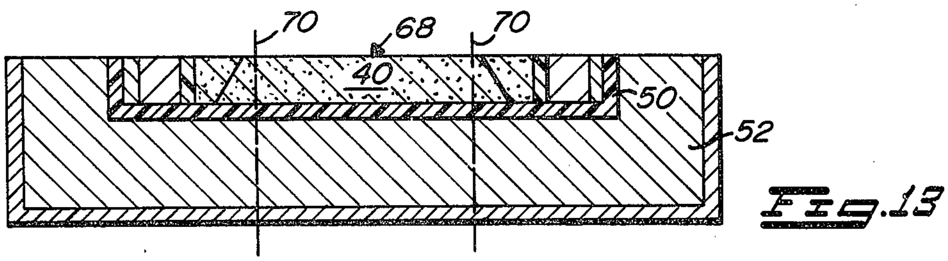
Figure 14:
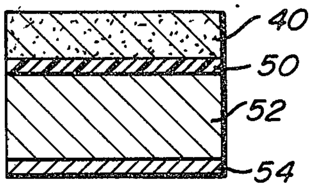

FIG. 13, which is inverted with respect to FIG. 12, illustrates the starting material which is the product of the immediately foregoing process of the invention. Since the starting material of FIG. 13 does not include a buried P+ layer similar to layer 18, the associated out-diffusion and capacitance problems are eliminated. Furthermore, the structure of FIG. 13 can be severed along cutting lines illustrated by dashed lines 70 to provide the starting material illustrated in FIG. 14.

What has been described, therefore, are processes for providing a high quality monocrystalline silicon on an insulating substrate. The starting material of the one process includes a P+ layer which may be utilized to form buried layers for PNP transistors, which reduce collector resistances in a known manner, and the starting material of another process facilitates fabrication of devices which do not include buried layers. In any case the starting materials are suitable to be employed for the manufacture of reliable, solid-state components having high densities, high frequency responses and fast switching times. Also, in any case, the resulting epitaxial layers can be doped or provide a base on which other layers are formed in accordance with known processes without departing from the scope of the present invention.

What is claimed is:

1. A method of manufacture for providing a thin layer of high quality monocrystalline silicon on an insulating substrate to form a starting material in which monolithic integrated circuits having high frequency active devices can be fabricated, such method comprising:

providing a silicon wafer having a predetermined crystallographic orientation and first and second surfaces;

forming a layer of boron doped silicon having a first surface of a first concentration of dopant adjacent said first surface of said silicon wafer and an exposed second surface having a second concentration of dopant, said layer of doped silicon having an intermediate portion between said first and second surfaces having a concentration of dopant intermediate said first and second concentrations, said intermediate concentration being selected to retard the etch rate of a selective etchant;

forming a first layer of insulating material over said surfaces of said silicon wafer and said layer of doped silicon;

forming a first supporting layer over a portion of said first layer of insulating material;

exposing said second surface of said silicon wafer;

applying a selective etchant to said second surface of said silicon wafer, said etchant removing said silicon wafer at a first rate until a portion of said silicon near said intermediate portion of said layer of doped silicon is exposed, said concentration of dopant of said remaining boron doped silicon being selected to have an etch rate which is substantially less than said first etch rate;

epitaxially forming the thin layer of monocrystalline silicon on said exposed surface of said layer of doped silicon, said thin layer of monocrystalline silicon having a first surface and an exposed surface;

forming a second layer of insulating material over said exposed surface of said thin layer of monocrystalline silicon;

forming a second supporting layer over said second layer of insulating material; and selectively removing portions of said first supporting layer, said first layer of insulating material and said layer of doped silicon to expose a surface of said thin layer of monocrystalline silicon through which field effect and bipolar devices can be fabricated.

2. The method of claim 1 wherein said silicon wafer has a crystallographic orientation.

3. The method of claim 1 wherein said step of forming a layer of doped silicon utilizes a boron impurity wherein said first concentration is on the order of $1 \times 10^{17}$ atoms per cubic centimeter and said second concentration of said second surface is on the order of $6 \times 10^{19}$ atoms per cubic centimeter.

4. The method of claim 1 wherein said layer of doped silicon is formed by epitaxial growth.

5. The method of claim 1 wherein said layer of doped silicon is formed by diffusion.

6. The method of claim 1 wherein said first layer of insulating material is comprised of silicon dioxide.

7. The method of claim 1 wherein said first layer of insulating material is comprised of silicon nitride.

8. The method of claim 1 wherein said first supporting layer is comprised of polycrystalline silicon.

9. The method of claim 1 wherein said selective etchant includes potassium hydroxide.

10. The method of claim 1 wherein said step of forming a layer of doped silicon includes diffusing a boron impurity through said first surface of said silicon wafer.

11. The method of claim 1 wherein said step of forming a layer of doped silicon includes epitaxially growing a P+ layer upon said first surface of said silicon wafer.

12. The method of claim 1 further including the step of removing some of said thin layer of monocrystalline underlying said first surface of said thin layer of monocrystalline silicon.

13. The method of claim 1 wherein said second layer of insulating material is comprised of silicon dioxide.

14. The method of claim 1 wherein said second supporting layer is comprised of polycrystalline silicon.

* * * * *

UNITED STATES PATENT AND TRADEMARK OFFICE

CERTIFICATE OF CORRECTION

PATENT NO. : 3,929,528
DATED : December 30, 1975
INVENTOR(S) : Uryon S. Davidsohn; James B. Price It is certified that error appears in the above-identified patent and that said Letters Patent are hereby corrected as shown below:

[19] Change from Davidson to "Davidsohn".

[54] Change from MONOCRIPTALLINE to "MONOCRYSTALLINE".

[75] Change from Davidson to "Davidsohn".

In the Specification, column 1, line 1 change MONOCRIPTALLINE to "MONOCRYSTALLINE".

Signed and Sealed this

*first* Day of *June 1976*

[SEAL]

*Attest:*

RUTH C. MASON
*Attesting Officer*

C. MARSHALL DANN
*Commissioner of Patents and Trademarks*